(12) United States Patent
He

(10) Patent No.: US 7,382,817 B2
(45) Date of Patent: Jun. 3, 2008

(54) V-COUPLED-CAVITY SEMICONDUCTOR LASER

(76) Inventor: Jian-Jun He, 40 College Circle, Ottawa (CA) K1K 4R8

( * ) Notice: Subject to any disclaimer, the term of this patent is extended or adjusted under 35 U.S.C. 154(b) by 24 days.

(21) Appl. No.: 11/306,520

(22) Filed: Dec. 30, 2005

(65) Prior Publication Data
US 2006/0251139 A1    Nov. 9, 2006

Related U.S. Application Data

(63) Continuation-in-part of application No. 10/908,362, filed on May 9, 2005, now abandoned.

(51) Int. Cl.
*H01S 3/03* (2006.01)
(52) U.S. Cl. .............................. 372/64; 372/66; 372/68
(58) Field of Classification Search .................. 382/64, 382/66, 68
See application file for complete search history.

(56) References Cited

U.S. PATENT DOCUMENTS

| | | |
|---|---|---|
| 4,899,360 A | 2/1990 | Fujita |
| 5,115,444 A | 5/1992 | Kirkby |
| 5,995,530 A | 11/1999 | Dutting |
| 6,028,881 A | 2/2000 | Ackerman |
| 6,282,213 B1 | 8/2001 | Gutin |
| 6,636,678 B1 * | 10/2003 | Bendett et al. ............. 365/132 |
| 6,687,267 B2 | 2/2004 | Bukkems |
| 6,714,566 B1 | 3/2004 | Coldren |
| 6,728,279 B1 | 4/2004 | Sarlet |
| 6,822,981 B2 | 11/2004 | Jacquet |
| 6,865,195 B2 | 3/2005 | Jacquet |
| 2005/0226283 A1 * | 10/2005 | He .............................. 372/20 |

* cited by examiner

*Primary Examiner*—Dung T Nguyen

(57) ABSTRACT

A semiconductor laser comprises two optical cavities, each comprising an optical waveguide bounded by two partially reflecting elements. The two optical waveguides are disposed on a substrate to form a substantially V-shaped geometry with substantially no cross-coupling at the open end and a predetermined cross-coupling at the closed end for achieving an optimal single-mode selectivity of the laser. The first cavity has a length such that its resonant wavelengths correspond to a set of discrete operating channels. The second cavity has a slightly different length so that only one resonant wavelength coincides with one of the resonant wavelengths of the first cavity over the operating spectral window. The lasing action occurs at the common resonant wavelength. In operation, at least a portion of the optical waveguide in each of the first and the second cavities are forward biased to provide substantially equal round-trip optical gains. The second cavity is tuned by varying the effective refractive index of a portion of the waveguide through an electrical means, resulting in wavelength switching among the set of discrete operating wavelengths as determined by the first cavity.

18 Claims, 10 Drawing Sheets

V-COUPLED-CAVITY SEMICONDUCTOR LASER

RELATED APPLICATIONS

This application is a continuation-in-part of U.S. patent application Ser. No. 10/908,362, filed on May 9, 2005, which claims benefit from U.S. Provisional Patent Application Ser. No. 60/569,080, filed on May 10, 2004.

FIELD OF THE INVENTION

This invention relates generally to a semiconductor laser, and more particularly to a monolithically integrated single-mode wavelength-switchable semiconductor laser.

BACKGROUND OF THE INVENTION

Widely tunable lasers are of great interest for both long-haul and metropolitan optical networks. Besides their use for source sparing with the advantages of reduced inventory and cost, they open the possibility of new system architectures with more efficient and more flexible network management. For example, the combination of tunable lasers with wavelength routers can provide large format-independent space switches and reconfigurable optical add/drop functions.

Monolithically integrated semiconductor tunable lasers offer many advantages over external-cavity tunable lasers assembled from discrete components. They are compact, low-cost, and more reliable as they contain no moving parts. A conventional monolithic tunable laser usually comprises a multi-electrode structure for continuous tuning. FIG. 1 shows a prior-art example of a semiconductor tunable laser consisting of a distributed Bragg reflector (DBR) grating, an active gain section, and a phase shift region. An electrode for electrical control is disposed on top of each of the three sections. When the reflection peak wavelength of the DBR grating is tuned by injecting current or applying an electrical voltage, the phase shift region must be adjusted simultaneously in order to prevent the laser from hopping from one mode to another. Besides, the tuning range of such a laser is limited to about 10 nm due to the limitation of commonly achievable refractive index change in semiconductor materials.

A more sophisticated tunable laser with a wider tuning range and improved performances was described by V. Jarayman, Z. M. Chuang, and L. A. Coldren, in an article entitled "Theory, design, and performance of extended tuning range semiconductor lasers with sampled gratings", IEEEJ. Quantum Electron. Vol. 29, pp. 1824-1834, 1993. It comprises of four electrodes controlling two sampled grating distributed Bragg reflectors, a phase-shift region and a gain section. The wavelength tuning requires complex electronic circuits with multidimensional current control algorithms and look-up tables. Such complexity reduces the fabrication yield and increases the cost, and also opens the questions about the manufacturability and long term stability of the devices.

A widely tunable or wavelength switchable laser can also be realized by using two coupled cavities of slightly different lengths. The tuning range is greatly increased by using the Vernier effect. The coupled-cavity laser can be fabricated either by etching a groove inside a cleaved Fabry-Perot laser, as described in a paper entitled "Monolithic two-section GaInAsP/InP active-optical-resonator devices formed by reactive-ion-etching", by L. A. Coldren et al, Appl. Phys. Lett., vol. 38, pp. 315~317, 1981, or by using a cleaved-coupled-cavity structure, as described in a paper entitled "The cleaved-coupled-cavity (C3) laser", by W. T. Tsang, Semiconductors and Semimetals, vol. 22, p. 257, 1985. However, the performance of the prior-art coupled-cavity lasers especially in terms of mode selectivity is not satisfactory, which results in very limited use for practical applications.

In co-pending U.S. patent application Ser. No. 10/908,362 entitled "Wavelength switchable semiconductor laser", a serially coupled cavity structure with an optimal coupling coefficient for improved mode selectivity is disclosed for operation as a wavelength switchable laser. The present patent application discloses a new parallelly coupled cavity structure for achieving a high single-mode selectivity.

Parallelly coupled-cavity lasers have previously been investigated in the form of a Y-laser, as described in an article entitled "The Y-laser: A Multifunctional Device for Optical Communication Systems and Switching Networks", O. Hildebrand, M. Schilling, D. Baums, W. Idler, K. Dutting, G. Laube, and K. Wunstel, Journal of Lightwave Technology, vol. 11, no. 2, pp. 2066-2074, 1993, and the references therein. FIG. 2 shows a schematic diagram of the Y-coupled-cavity laser. The Y-laser has the advantage of being monolithic without the challenging fabrication requirement for deeply and vertically etched trenches. However, the mode selectivity of the Y-laser is very poor, with a side-mode threshold difference of only about 1 $cm^{-1}$ for a 450 μm laser, compared to over 10 $cm^{-1}$ for a typical DFB laser. This is far from sufficient for stable single-mode operation, especially when the laser is directly modulated.

The present invention provides a substantially improved structure using V-coupled cavities. This design allows an optimized coupling coefficient between two cavities to be realized to achieve significantly improved single-mode selectivity, while allowing the lasing wavelength to be tuned over a wide range.

For many applications, it is not necessary to tune the laser wavelength continuously. Rather, it is only required that the laser can be set to any discrete wavelength channel, e.g. as defined by the ITU (International Telecommunication Union). Such applications include linecard sparing, wavelength routing and optical add/drop. Key requirements for such wavelength switchable lasers are: 1) an accurate match of the discrete operating wavelengths with the predefined wavelength channels (e.g. ITU grid); 2) simple and reliable control for the switching between various wavelength channels; 3) high side-mode suppression ratio and low crosstalk; 4) fast switching speed; and 5) easy to fabricate and low cost.

It is an object of the present invention to provide a monolithically integrated single-mode wavelength-switchable semiconductor laser that satisfies all of the above requirements.

SUMMARY OF THE INVENTION

In accordance with the invention, there is provided, a semiconductor laser comprising:

a first optical cavity comprising a first optical waveguide bounded by two partially reflecting elements, at least a portion of said first optical waveguide being pumped to provide optical gain, a second optical cavity comprising a second optical waveguide bounded by two partially reflecting elements, at least a portion of said second optical waveguide being pumped to provide optical gain, whereas the first and the second optical waveguides have different optical path lengths, and are disposed side-by-side on a substrate to form substantially V-shaped waveguide branches with substantially no cross-coupling at the open end and a predetermined cross-coupling at the closed end for achieving an optimal single-mode selectivity of the laser.

DETAILED DESCRIPTION

Figure 1:
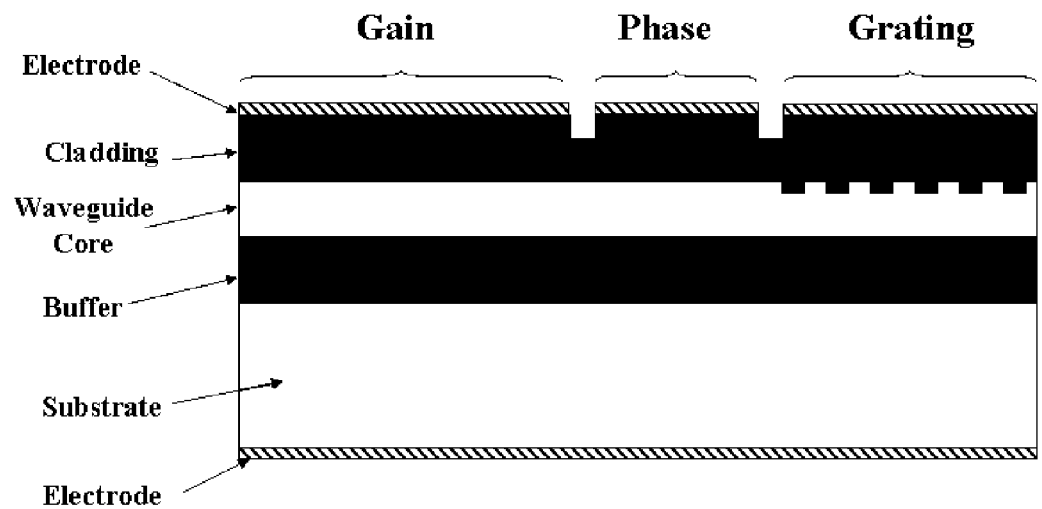
FIG. 1 is a prior art semiconductor tunable laser consisting of a DBR grating, an active gain section, and a phase-shift region.
Figure 2:
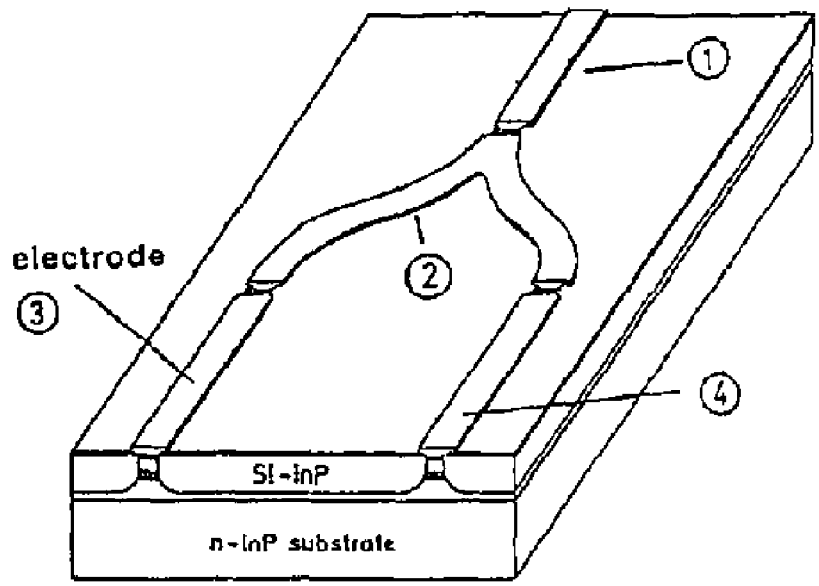
FIG. 2 is a prior-art Y-coupled-cavity laser.
Figure 3:
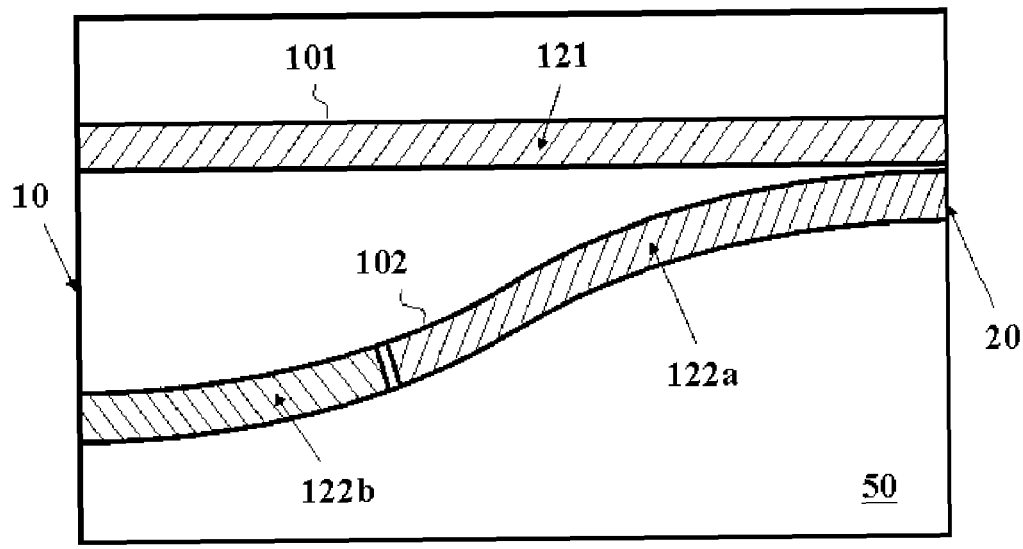
FIG. 3 is the top view of a monolithic wavelength switchable V-coupled-cavity laser in accordance with one embodiment of the present invention.

FIG. 3 shows the top view of a monolithic wavelength switchable V-coupled-cavity laser in accordance with one embodiment of the present invention. The laser consists of two waveguides branches 101 and 102 forming a substantially V-shaped geometry, disposed on a semiconductor chip 50. They are closely spaced or touching on one end (i.e. the closed end) but far apart on the other end (i.e. the open end). Bounded by cleaved facets 10 and 20 (or etched trenches in an alternative embodiment), each of the two waveguide branches forms a Fabry-Perot cavity. Near the end facet 20 where the two waveguides are closely spaced or touching, a small amount of light is coupled from one cavity to the other, due to evanescent coupling or overlap of mode fields. An electrode 121 is deposited on top of the waveguide branches 101 while two electrodes 122a and 122b are deposited on top of the waveguide branches 102. In operation, the electrodes 121a and 122a are injected with essentially fixed currents to produce optical gain for the laser, while the electrode 122b is used to apply a variable current or voltage in order to change the refractive index of the underlying waveguide and to switch the laser wavelength.

Figure 4A:
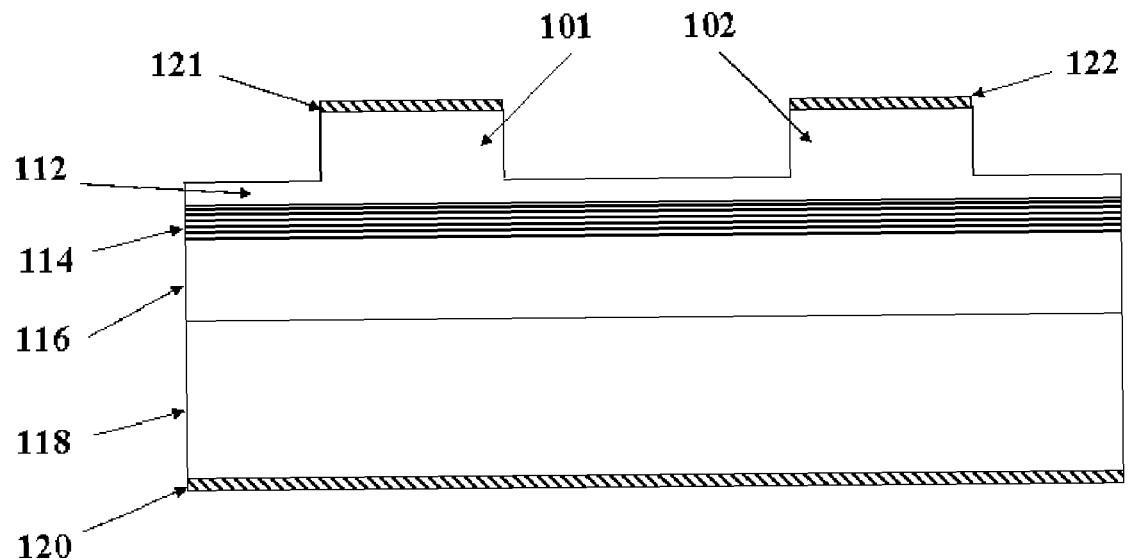
FIG. 4(a) is a typical cross-sectional view perpendicular to the waveguides of the laser.

A typical cross-sectional view perpendicular to the waveguides of the laser is shown in FIG. 4(a). The waveguide structure generally consists of a buffer layer 116, waveguide core layer 114 that provides an optical gain when electrically pumped (with a current injection), and an upper cladding layer 112, deposited on a substrate 118. The backside of the substrate is deposited with a metal electrode layer 120 as a ground plane. Preferably the waveguide core layer comprises multiple quantum wells and the layers are appropriately doped as in conventional laser structures. An example material system is InGaAsP/InP. In the transverse direction, standard ridge or rib waveguides 101 and 102 are formed to laterally confine the optical mode, with electrode 121 and 122 deposited thereon. The structure may further include a current blocking layer to improve the electrical characteristics.

Figure 4B:
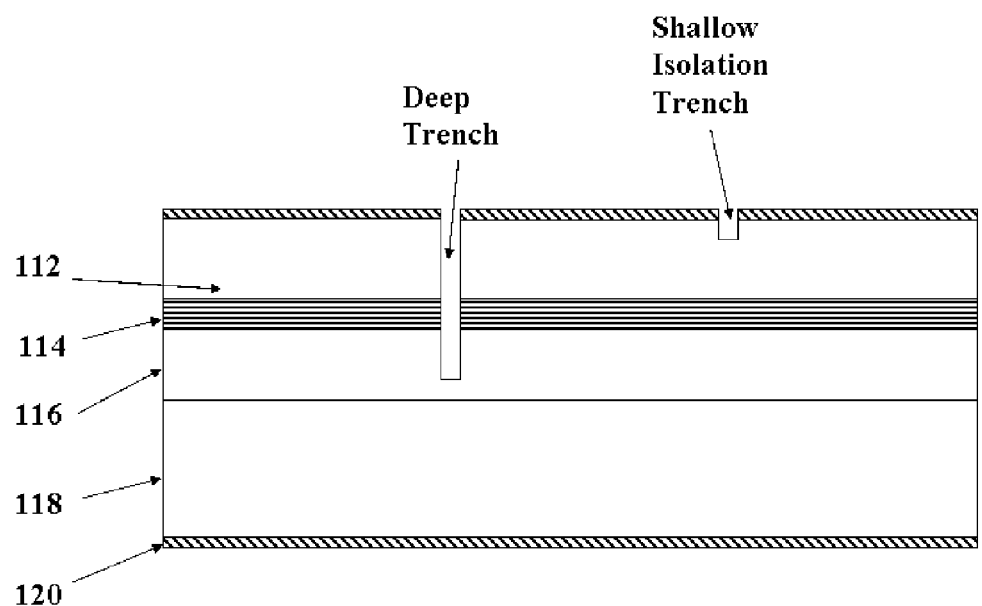
FIG. 4(b) is the cross-sectional view along a waveguide showing the shallow isolation trench and the deeply etched partially-reflecting trench used in some embodiments of the present invention.

The waveguide core in the wavelength switching segment under the electrode 122b preferably has a larger bandgap energy than that of the gain segments under the electrodes 121 and 122a. This allows a large refractive index change to be obtained at the laser wavelength when an electrical current or voltage is applied on the electrode 122b, without introducing a significant gain variation. The different bandgap energies in different sections of the monolithic device can be obtained by using a quantum well intermixing technique, or by using an etch-and-regrowth method. The electrodes 122a and 122b are separated by a shallow isolation trench, as shown in FIG. 4(b). Alternatively, a simplified embodiment may be envisaged by combining the segments 122a and 122b into a single gain segment with a variable current injection to provide a gain and a refractive index change simultaneously.

In accordance with one aspect of the present invention, the length of the fixed gain cavity 101 is chosen so that its resonance frequency interval matches the spacing of the operating frequency grid, an example being the widely used frequency grid defined by ITU (e.g. spaced at 200 GHz, 100 GHz or 50 GHz). The resonance frequency interval is determined by $$\Delta f = \frac{c}{2n_g L} \quad (1)$$

where c is the light velocity in vacuum, $n_g$ the effective group refractive index of the waveguide, and L the length of the fixed gain cavity 101.

Similarly, the resonance frequency interval $\Delta f'$ of the second cavity comprising the waveguide branch 102 (hereafter referred as the channel selector cavity) is determined by $$\Delta f' = \frac{c}{2n_g' L'} = \frac{c}{2(n_a L_a + n_b L_b)} \quad (2)$$

where $L_a$ and $L_b$ are the lengths of the segments 122a and 122b, respectively, $n_a$ and $n_b$ are the effective group refractive indices of the segments 122a and 122b, respectively, $L'=L_a+L_b$ is the total length, and $n'_g=(n_a L_a+n_b L_b)/L'$ is the average effective group refractive index of the channel selector cavity 102.

Figure 5:
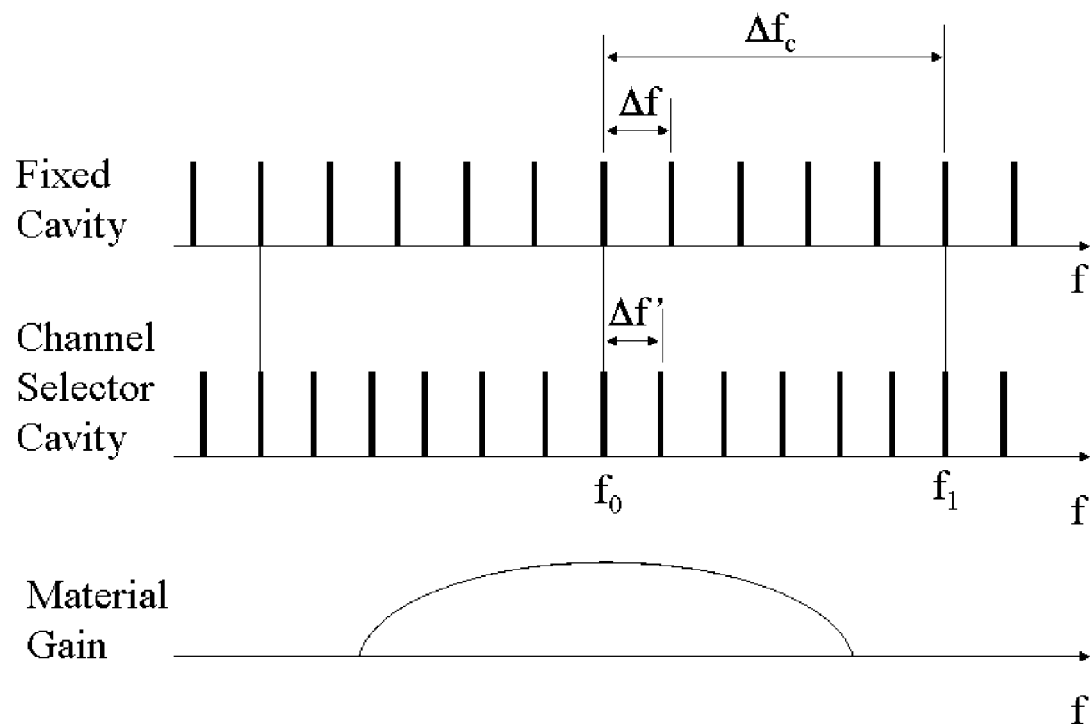
FIG. 5 is a schematic diagram showing the relationships between the two sets of resonant peaks of the fixed gain cavity and the channel selector cavity, and the material gain spectrum.

The resonance frequency interval $\Delta f'$ of the channel selector cavity is chosen to be slightly different than $\Delta f$ so that only one resonant peak coincides with one of the resonant peaks of the fixed gain cavity over the material spectral gain window, as shown in FIG. 5. The distance between two aligned resonant peaks, which corresponds to the free spectral range (FSR) of the combined cavity, is determined by $$\Delta f_c = \frac{\Delta f \Delta f'}{|\Delta f - \Delta f'|} \quad (3)$$

In order not to have two wavelengths lasing simultaneously, $\Delta f_c$ should generally be larger than the spectral width of the material gain window.

The resonant frequencies of the fixed gain cavity and the channel selector cavity are determined respectively by $$f = \frac{mc}{2nL} \quad (4a)$$

$$f' = \frac{m'c}{2n'L'} \quad (4b)$$

where m and m' are integers, n and n' the averaged effective refractive index of the waveguide within the respective cavity, L and L' the cavity lengths. The frequency of the channel selector can be tuned by varying the effective index n' or $n_b$ of the segment 122b. The rate of the tuning is determined by $$\frac{\delta f'}{f'} = -\frac{\delta n'}{n'} = -\frac{\delta n_b L_b}{n_b L'} \quad (5)$$

Since the laser frequency is determined by the resonant peak of the fixed gain cavity that coincides with a peak of the channel selector cavity, a shift of $|\Delta f-\Delta f'|$ in the resonant peaks of the channel selector cavity results in a jump of a channel in the laser frequency. Therefore, the change of the laser frequency with the refractive index variation is amplified by a factor of $\Delta f/|\Delta f-\Delta f'|$, i.e., $$\delta f = \frac{\Delta f}{|\Delta f - \Delta f'|} \delta f' \quad (6)$$

The increased tuning range is one of the advantages of the device of the present invention. Consider an example in which $\Delta f$=100 GHz, and $\Delta f'$=90 GHz, the range of the laser frequency variation is increased by a factor of 10 with respect to what can be achieved by the index variation directly. For this numerical example, assuming the effective group refractive index of the waveguide is 3.215, the lengths of the fixed gain cavity and the channel selector cavity are L=466.24 µm and L'=518.31 µm, respectively. The device length is therefore comparable to conventional DFB or FP lasers.

An important difference between the V-coupled-cavity laser of the present invention and the prior-art Y-coupled-cavity laser is that the light is partially coupled from one branch to the other without going through a common waveguide section. As we will see later, this allows an optimal amount of light to be coupled from one cavity to the other (i.e. cross-coupling), relative to the amount of light coupled back to the same cavity (i.e. self-coupling). As a result, a much higher single-mode selectivity can be achieved with the V-laser as compared with the Y-laser.

Referring again to FIG. 3, assume the amplitude reflectivities of the cleaved facets 10 and 20 are $r_1$ and $r_2$, respectively. The coupling between the waveguides occurs near the facet 20. We denote the amplitude coupling coefficients from waveguide 101 to waveguide 102 (cross-coupling), from waveguide 101 back to waveguide 101 (self-coupling), from waveguide 102 to waveguide 101 (cross-coupling), and from waveguide 102 back to waveguide 102 (self-coupling), as $C_{12}$, $C_{11}$, $C_{21}$ and $C_{22}$, respectively. For simplicity, we assume there is no excess coupling loss. Therefore, we have $|C_{11}|^2+|C_{12}|^2=1$ and $|C_{21}|^2+|C_{22}|^2=1$. From the reciprocity of light wave propagation, we also have $C_{12}=C_{21}$. Note that the facet reflectivity is treated separately and is not included in the coupling coefficients.

In the following section, for simplicity and without losing generality, we will treat the waveguide 102 as a uniform waveguide with an average effective refractive index of n'. To analyze the V-coupled-cavity laser, we consider one of the Fabry-Perot cavities as the main laser cavity and include the coupling effect of the other cavity in one of the mirrors of the main cavity. First, let us consider the fixed gain cavity comprising waveguide 101 as the main cavity. The effective reflectivity of the facet 20 for this cavity can be written as $r_{2e}=\eta r_2$, where η is an effective reflection factor (in amplitude) taking into account the coupling effect of the channel selector cavity comprising waveguide 102 and is calculated by $$\eta = C_{11} + C_{21}C_{12}r_1r_2e^{2(g'+ik')L'}\left(1 + C_{22}r_1r_2e^{2(g'+ik')L'} + \right. \quad (7)$$

$$\left. C_{22}^2r_1^2r_2^2e^{4(g'+ik')L'} + ...\right)$$

$$= C_{11} + \frac{C_{21}C_{12}r_1r_2e^{2(g'+ik')L'}}{1 - C_{22}r_1r_2e^{2(g'+ik')L'}}$$

The threshold condition can therefore be written as $$r_1\eta r_2 e^{2(g+ik)L} = 1 \quad (8)$$

In the above equations, $k(=2\pi n/\lambda)$ and g are, respectively, the propagation constant and gain coefficient of the waveguide 101, and $k'(=2\pi n'/\lambda)$ and g' are, respectively, the average propagation constant and average gain coefficient of the waveguide 102.

Similarly, we can also consider the channel selector cavity comprising waveguide 102 as the main laser cavity. The effective reflectivity of the facet 20 for this cavity can be written as $r'_{2e} = \eta' r_2$, where $\eta'$ is the effective reflection factor taking into account the coupling effect of the fixed gain cavity and is calculated by $$\eta' = C_{22} + C_{21}C_{12}r_1r_2e^{2(g+ik)L}(1 + C_{11}r_1r_2e^{2(g+ik)L} + \quad (9)$$

$$C_{11}^2r_1^2r_2^2e^{4(g+ik)L} + ...)$$

$$= C_{22} + \frac{C_{21}C_{12}r_1r_2e^{2(g+ik)L}}{1 - C_{11}r_1r_2e^{2(g+ik)L}}$$

The threshold condition for the laser can then be written as $$r_1\eta' r_2 e^{2(g'+ik')L'} = 1 \quad (10)$$

After some manipulation, it can be shown that Eqs. (8) and (10) are identical. They both lead to the following threshold condition of the V-coupled-cavity laser, $$\frac{C_{11}r_1r_2e^{2(g+ik)L} + C_{22}r_1r_2e^{2(g'+ik')L'} - (C_{11}C_{22} - C_{12}C_{21})}{r_1^2r_2^2e^{2(g+ik)L}e^{2(g'+ik')L'}} = 1 \quad (11)$$

This complex equation, which can be separated into two equations corresponding to the real and imaginary parts, determines the wavelengths of the lasing modes as well as their corresponding threshold gain coefficients. In the case of uncoupled cavities, i.e., $C_{12}=C_{21}=0$ and $C_{11}=C_{22}=1$, we have $\eta=\eta'=1$, and Eqs. (8), (10) and (11) reduce to the threshold conditions of conventional Fabry-Perot cavities.

Now we use a numerical example to illustrate the characteristics of the V-coupled-cavity laser. Consider the previously mentioned example where n=n'=3.215, L=466.24 μm (Δf=100 GHz), and L'=518.31 μm (Δf'=90 GHz). The two cavities have a common resonance wavelength at 1550.12 nm, corresponding to a frequency of 193400 GHz. Assume $C_{11}=C_{22}=0.95$, $C_{12}=C_{21}=0.31$, and the reflecting mirrors of the cavities are formed by cleaved facets, i.e., $r_1=r_2=(n-1)/(n+1)=0.5255$. Also assume that the two cavities are pumped to produce the same round trip gain, i.e., gL=g'L'. For the lowest threshold mode at the common resonance wavelength of 1550.12 nm, solving equation (11) leads to the threshold gain coefficients (in intensity) G=2g=22.6 cm$^{-1}$ and G'=2g'=20.4 cm$^{-1}$. These compare to the threshold gain coefficients of uncoupled cavities of $G_0$=27.6 cm$^{-1}$ and $G'_0$=24.8 cm$^{-1}$, respectively.

Figure 6:
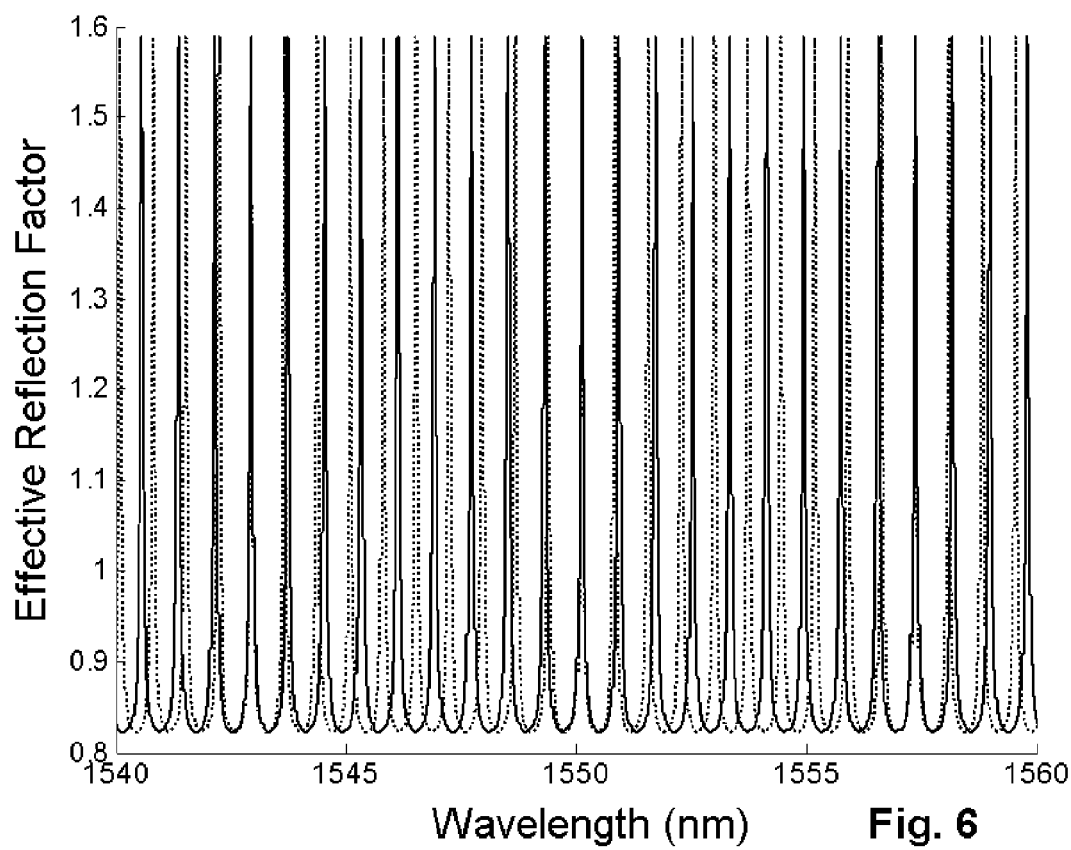
FIG. 6 is the effective reflection factors of the wavelength selector cavity (dotted line) and the fixed gain cavity (solid line) as a function of the wavelength when the laser is pumped at the threshold.

The mode selectivity and the wavelength switching function of the V-coupled-cavity laser can be understood from the effective reflection factors η and η', which are wavelength dependent functions with sharp resonant peaks. FIG. 6 plots their squared modulus $|\eta|^2$ (dotted line) and $|\eta'|^2$ (solid line), which are the effective reflection factors in intensity, as a function of the wavelength when the laser is pumped at the threshold. The periodic peaks of the effective reflection factor $|\eta|^2$ occur at the resonant wavelengths of the wavelength selector cavity (waveguide 102). The effective reflection factor $|\eta|^2$ effectively modifies the reflectivity of one of the mirrors of the fixed gain cavity (waveguide 101), producing a comb of reflectivity peaks similar to those of a prior-art sampled DBR grating (but without the fabrication complexity and long device length associated with it). Consequently, a resonant mode of the fixed gain cavity that coincides with one of the peaks of the effective reflection factor $|\eta|^2$ is selected as the lasing mode. Since the periodic peaks of the effective reflection factor $|\eta'|^2$ correspond to the resonant wavelengths of the fixed gain cavity, the lasing wavelength occurs at the position where a peak of $|\eta|^2$ overlaps with a peak of $|\eta'|^2$.

Figure 7:
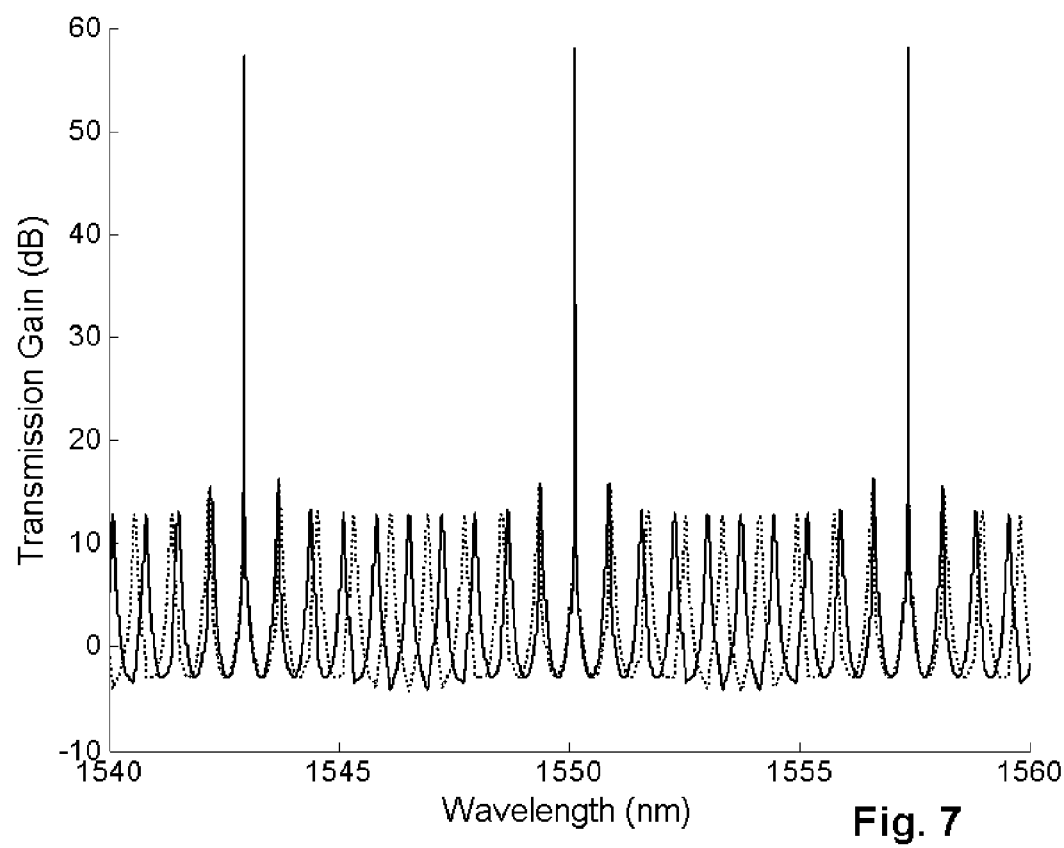
FIG. 7 is the small signal gain spectra of the laser near its threshold when the signal is transmitted through the fixed gain cavity (dotted line) and through the wavelength selector cavity (solid line).

FIG. 7 shows the small signal gain spectra of the laser near its threshold when the signal is transmitted through waveguide 101 (dotted line) and through the waveguide 102 (solid line). We can see that there are multiple lasing wavelengths separated by about 7.2 nm (900 GHz) as determined by Eq. (3). The variation of the material gain has not been considered in this calculation. In practice, the laser is limited to a single mode due to the limited material gain window and/or by adding an intracavity filter or a thin-film facet coating with a limited passband.

Figure 8:
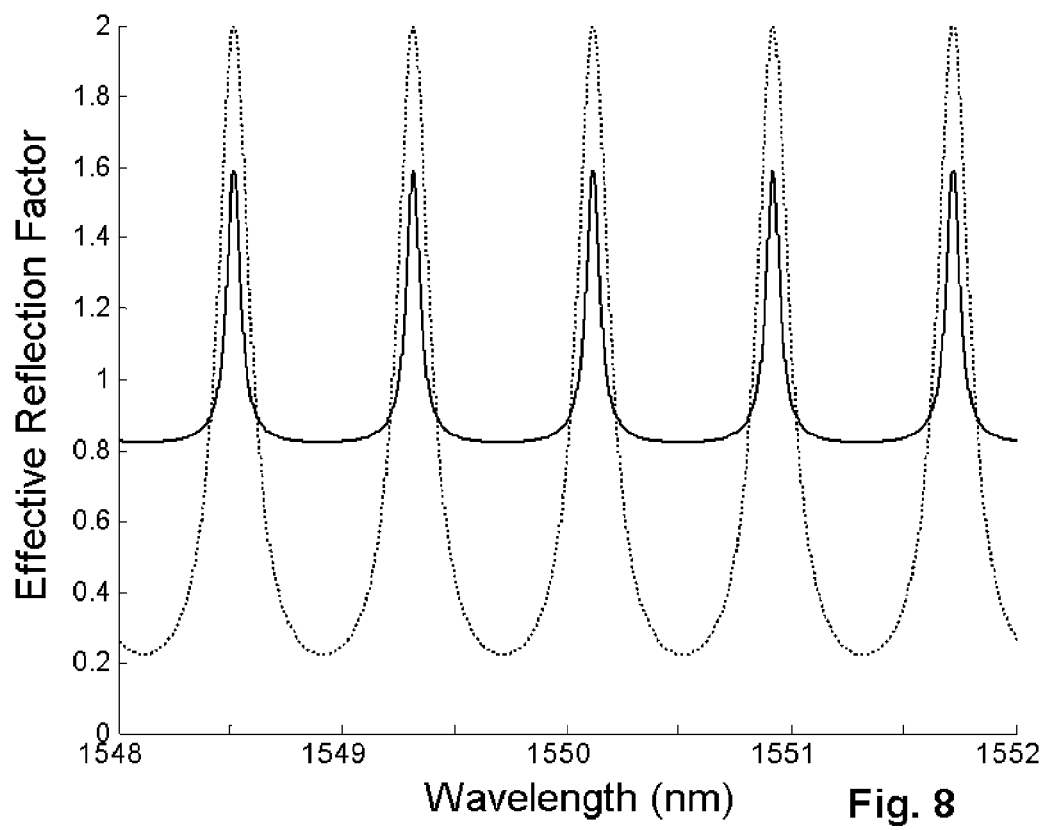
FIG. 8 is the spectra of the effective reflection factor for cross-coupling coefficient values of 0.1 (solid line) and 0.5 (dotted line).

The mode selectivity, which relates to side-mode suppression ratio (SMSR) or channel crosstalk in the case of wavelength switchable laser, is an important consideration in the design of the laser. The mode selectivity can be optimized by appropriately choosing the cross-coupling coefficient (i.e., $|C_{12}|^2=|C_{21}|^2$, in intensity). To illustrate the effect of the cross-coupling coefficient, we calculate the effective reflection factor $|\eta|^2$ as a function of wavelength for different values of the cross-coupling coefficient. FIG. 8 compares the spectra of the effective reflection factor $|\eta|^2$ for cross-coupling coefficient values of 0.1 (solid line) and 0.5 (dotted line), when the laser is pumped at the corresponding lasing threshold of G=22.6 cm$^{-1}$, and G=20.1 cm$^{-1}$, respectively. We can see that when the cross-coupling coefficient increases, the peaks of the effective reflection factor $|\eta|^2$, which is proportional to the effective reflectivity of one of the mirrors of the fixed gain cavity, become narrower while the contrast decreases.

Figure 9:
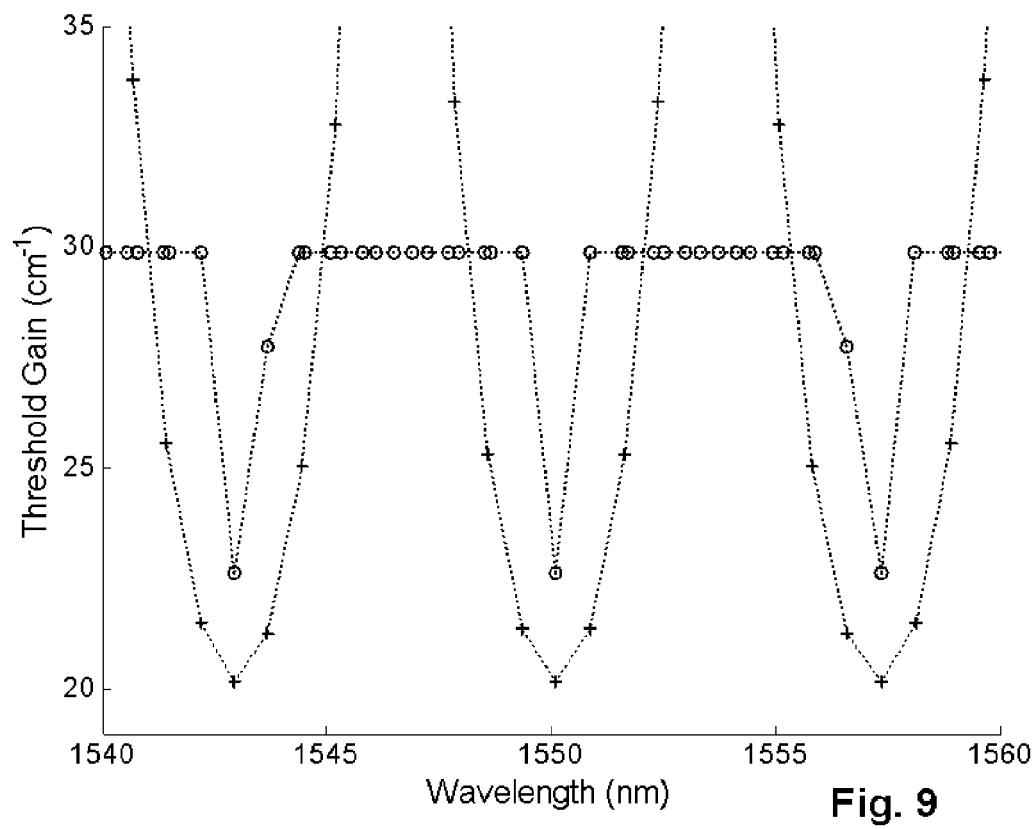
FIG. 9 is the lasing threshold of the cavity modes for two different cross-coupling coefficient values of 0.1 (circles) and 0.5 (crosses).

Since the discrimination of side modes is based on the misalignment of resonant modes between the fixed gain cavity and the channel selector cavity, the narrower the effective reflectivity peaks, the better the mode selectivity, especially for adjacent modes. Quantitatively, the mode selectivity can be characterized by threshold difference between the side modes and the main mode. FIG. 9 shows the lasing threshold of the cavity modes for two different cross-coupling coefficient values of 0.1(circles) and 0.5 (crosses). The threshold difference between the lowest threshold mode (the main mode) and the next lowest threshold mode is about 7.4 cm$^{-1}$ when the cross-coupling coefficient is 0.1, but is only about 1.2 cm$^{-1}$ when the cross-coupling coefficient is 0.5. The threshold (G=2g) of the main mode is 22.6 cm$^{-1}$ and 20.1 cm$^{-1}$ for the two cases, respectively.

Figure 10:
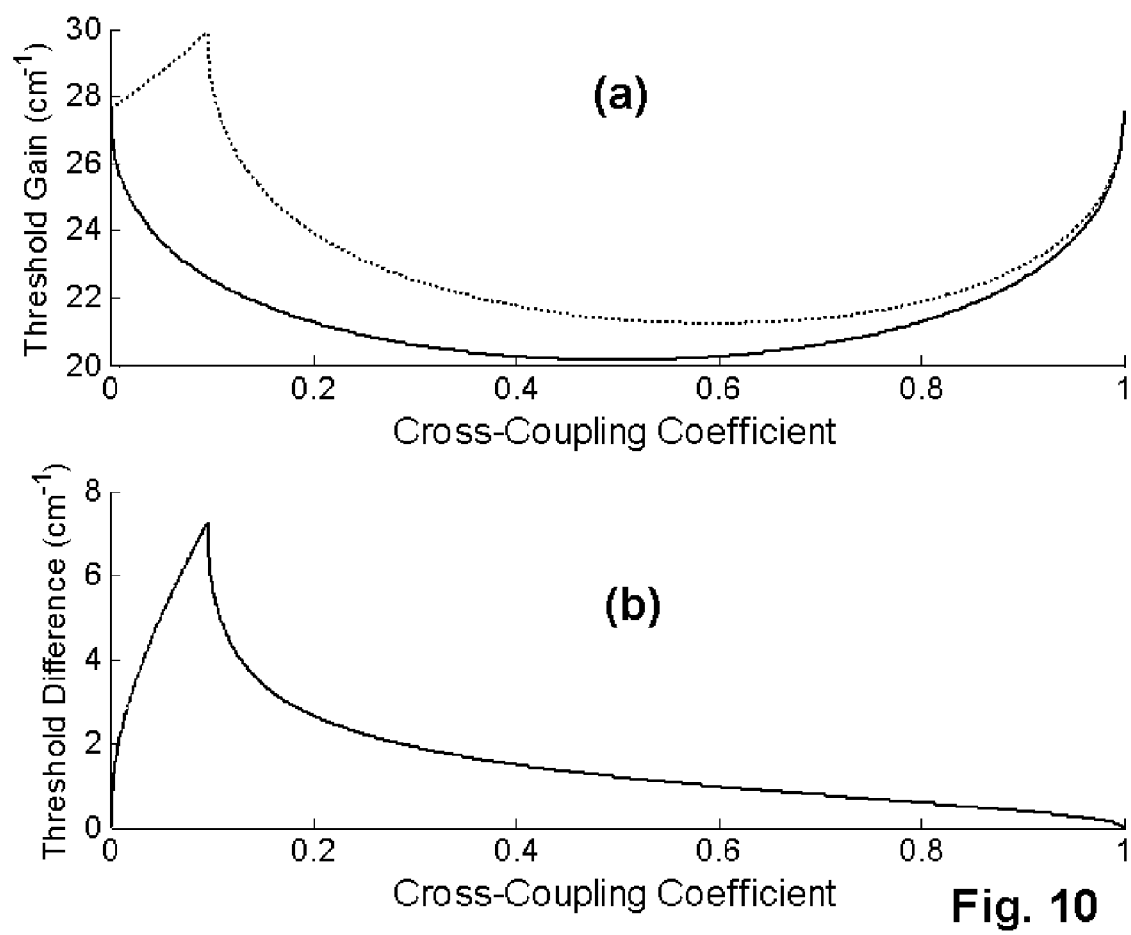
FIG. 10(a) is the threshold gain coefficient of the lowest threshold mode (solid line) and the next lowest threshold mode (dotted line) as a function of the cross-coupling coefficient.
FIG. 10(b) is the threshold difference between the lowest threshold mode and the next lowest threshold mode.

In FIG. 10(a), we plot the threshold gain coefficient G(=2g) of the lowest threshold mode (solid line) and the next lowest threshold mode (dotted line) as a function of the cross-coupling coefficient ($|C_{12}|^2=|C_{21}|^2$). The threshold difference between the two modes is plotted in FIG. 10(*b*). We can see that a cross-coupling coefficient around 0.1 gives the largest threshold difference, although a cross-coupling coefficient around 0.5 produces the lowest threshold for the main mode. The threshold difference increases as the cross-coupling coefficient decreases from 1to 0.1, because the peak width of the effective reflection factor $|\eta|^2$ decreases, resulting in an increased selectivity between the main mode and its adjacent modes. As the cross-coupling coefficient further decreases to below 0.1, the threshold difference decreases. This is because the peak width of the effective reflection factor $|\eta|^2$ becomes narrower than the mode spacing and it no longer affects the threshold difference. Instead, the threshold difference is determined by the contrast in the effective reflection factor $|\eta|^2$ which decreases with the decreasing cross-coupling coefficient.

Figure 11:
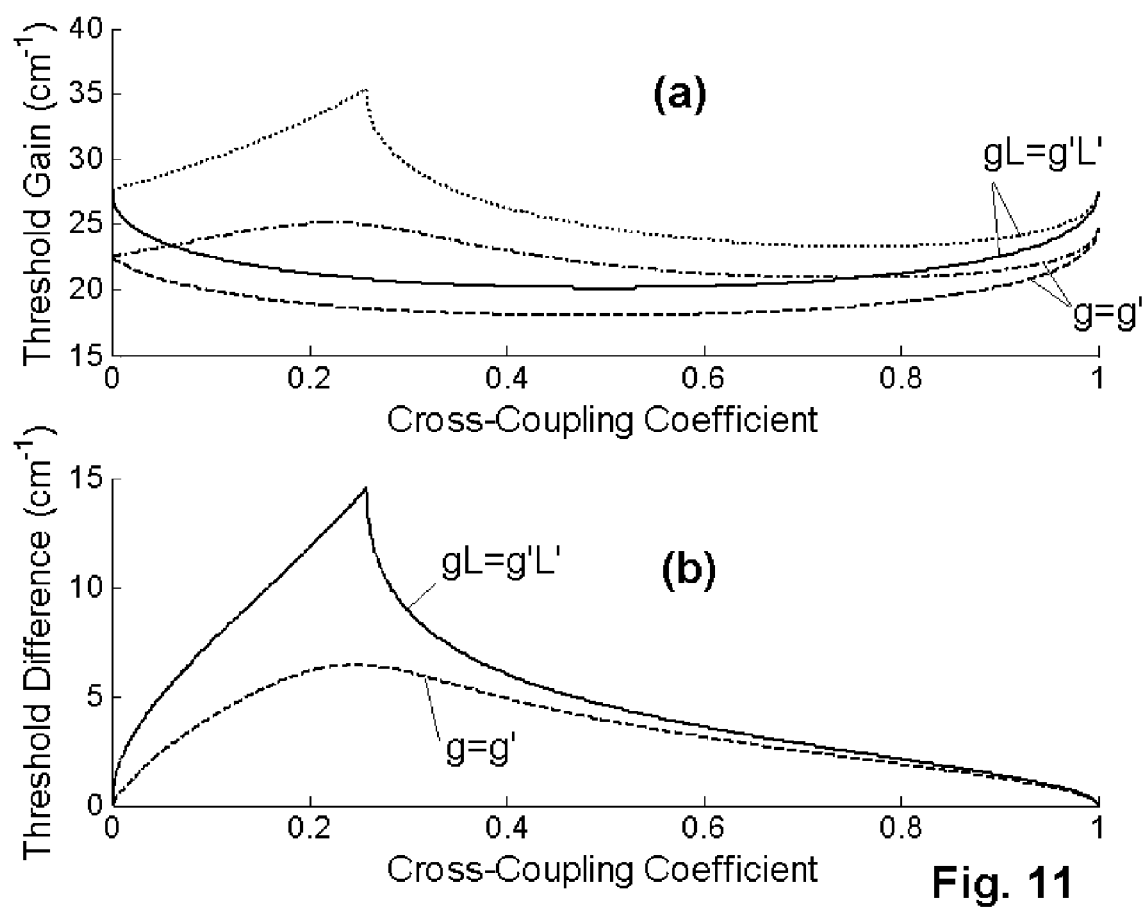
FIG. 11(a) is the threshold gain coefficient of the lowest threshold mode (solid line and dashed line) and the next lowest threshold mode (dotted line and dash-dotted line) as a function of the cross-coupling coefficient for two different pumping conditions corresponding to gL=g'L' and g=g'. The cavity length difference is doubled compared to the example of FIG. 10(a).
FIG. 11(b) is the threshold difference between the lowest threshold mode and the next lowest threshold mode for the cases gL=g'L' (solid line) and g=g' (dashed line). The cavity length difference is doubled compared to the example of FIG. 10(b).

By increasing the length difference between the fixed gain cavity and the channel selector cavity, the threshold difference between the lowest threshold mode and the next lowest threshold mode can be increased, at the expense of reduced free spectral range as determined by Eq. (3). It is also found that the maximum threshold difference is achieved when the round trip gains in the two cavities are equal, i.e. $gL=g'L'$ (assuming the cavity mirrors have the same reflectivities) or $r_1 r_2 e^{2gL} = r_1' r_2' e^{2g'L'}$. Consider the case L=466.24 μm (Δf=100 GHz) and L'=570.38 μm (Δf'=81.7 GHz) with other parameters the same as in the previous example. FIG. 11(*a*) shows the threshold of the lowest threshold mode (solid line and dashed line) and the next lowest threshold mode (dotted line and dash-dotted line) as a function of the cross-coupling coefficient for two different pumping conditions corresponding to $gL=g'L'$ and $g=g'$. FIG. 11(*b*) gives the threshold difference between the two modes for the cases $gL=g'L'$ (solid line) and $g=g'$ (dashed line). Compared to the previous example, the cavity length difference is almost doubled, and the free spectral range $\Delta f_c$ is reduced from 900 GHz to 446 GHz. The maximum achievable threshold difference is increased from 7.4 cm$^{-1}$ to 14.5 cm$^{-1}$ (for the case $gL=g'L'$), and the optimum cross-coupling coefficient at which the maximum threshold difference is achieved is increased from 0.1to 0.26.

As it can also be seen in FIG. 11, the maximum achievable threshold difference decreases as the pumping condition deviates away from the optimal condition of $gL=g'L'$ (or more generally, equal round trip gains). Therefore, it is preferable that gain variations be avoided when the refractive index of the channel selector cavity is changed to switch the laser wavelength. This can be realized by using a separate tuning section 122*b* in the channel selector cavity which is substantially passive (with little gain or loss), as shown in the embodiment of FIG. 3. This also allows flexible output power control independent of the wavelength switching.

It can also be envisaged to divide the waveguide 101 into two sections, each with a separate electrode, one for providing a fixed gain to the laser, and the other for continuously tuning the resonant wavelength grid of the "fixed" gain cavity over a channel spacing. By combining this wavelength tuning with the wavelength switching of the wavelength selector cavity, a continuous tuning of the laser wavelength over a wide wavelength range can be achieved.

Figure 12:
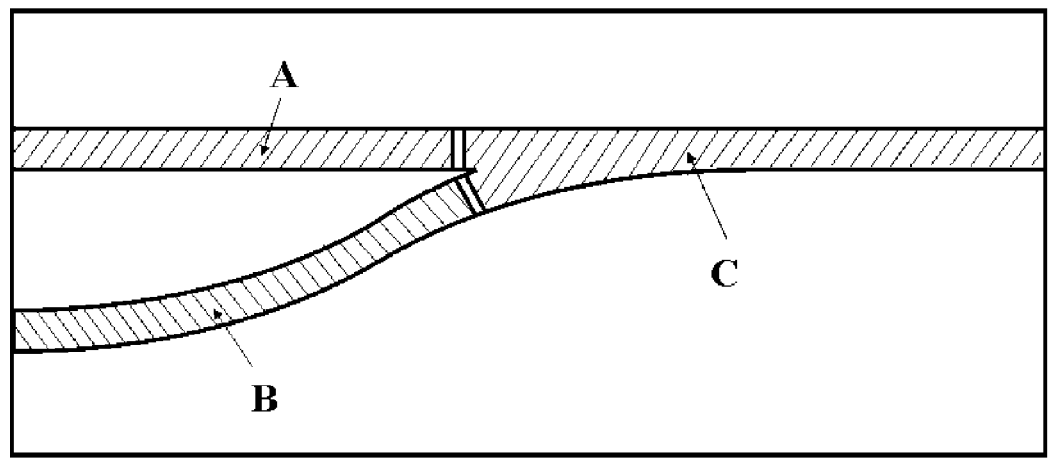
FIG. 12 is a schematic diagram of a Y-coupled-cavity laser for comparison analysis with the V-coupled cavity of the present invention.

Now let us examine the performance difference between the V-coupled-cavity laser of the present invention and the prior-art Y-coupled-cavity laser. Consider a Y-coupled-cavity laser as shown in FIG. 12 with two waveguide branches A, B and a common waveguide section C of length $L_a$, $L_b$ and $L_c$, respectively. The electrodes on the three waveguide sections are separated by shallow isolation trenches. The amplitude coupling coefficients from the common waveguide section C to waveguide A and B are denoted as $C_1$ and $C_2$, respectively. The amplitude coupling coefficients from waveguide A and B to the common waveguide section C are denoted as $C'_1$ and $C'_2$, respectively. From the reciprocity of light wave propagation, we have $C_1=C'_1$, and $C_2=C'_2$. Assuming there is no coupling loss, we have $|C_1|^2+|C_2|^2=1$.

Similar to the previous analysis for the V-coupled-cavity laser, we consider the fixed gain cavity comprising the waveguide sections A and C as the main laser cavity whose threshold condition can be written as $$\tau\tau' r_1 r_2 e^{2(g_a+ik_a)L_a} e^{2(g_c+ik_c)L_c} = 1 \quad (12)$$

where g and k are the gain coefficient and the propagation constant with the subscript indicating the corresponding waveguide section, $r_1$ and $r_2$ are the amplitude reflectivities of the cleaved facets (or cavity mirrors), $\tau'=C'^1$ is the amplitude transmission coefficient from the waveguide section A to waveguide section C, and $\tau$ is the effective amplitude transmission coefficients from the waveguide section C to waveguide section A. The coupling effect of the channel selector cavity comprising the waveguide sections B and C is included in the effective transmission coefficient $\tau$ which is calculated by $$\tau = C_1 + C_1 C_2 C'_2 r_1 r_2 e^{2(g_b+ik_b)L_b} e^{2(g_c+ik_c)L_c} + \quad (13)$$
$$C_1 C_2^2 C'^2_2 r_1^2 r_2^2 e^{4(g_b+ik_b)L_b} e^{4(g_c+ik_c)L_c} + \ldots$$
$$= \frac{C_1}{1 - C_2 C'_2 r_1 r_2 e^{2(g_b+ik_b)L_b} e^{2(g_c+ik_c)L_c}}$$

Substituting the expression of $\tau$ and $\tau'$ into Eq. (12) and after some manipulation, we obtain the following threshold condition of the Y-coupled-cavity laser, $$C_1 C'_1 r_1 r_2 e^{2(g+ik)L} + C_2 C'_2 r_1 r_2 e^{2(g'+ik')L'} = 1 \quad (14)$$

where $L=L_a+L_c$ and $L'=L_b+L_c$ are the total lengths of the fixed gain cavity and the wavelength selector cavity, respectively; $g=(g_a L_a+g_c L_c)/L$ and $g'=(g_b L_b+g_c L_c)/L'$ are the average gain coefficients; and $k=(k_a L_a+k_c L_c)/L$ and $k'=(k_b L_b+k_c L_c)/L'$ are the average propagation constants.

Figure 13:
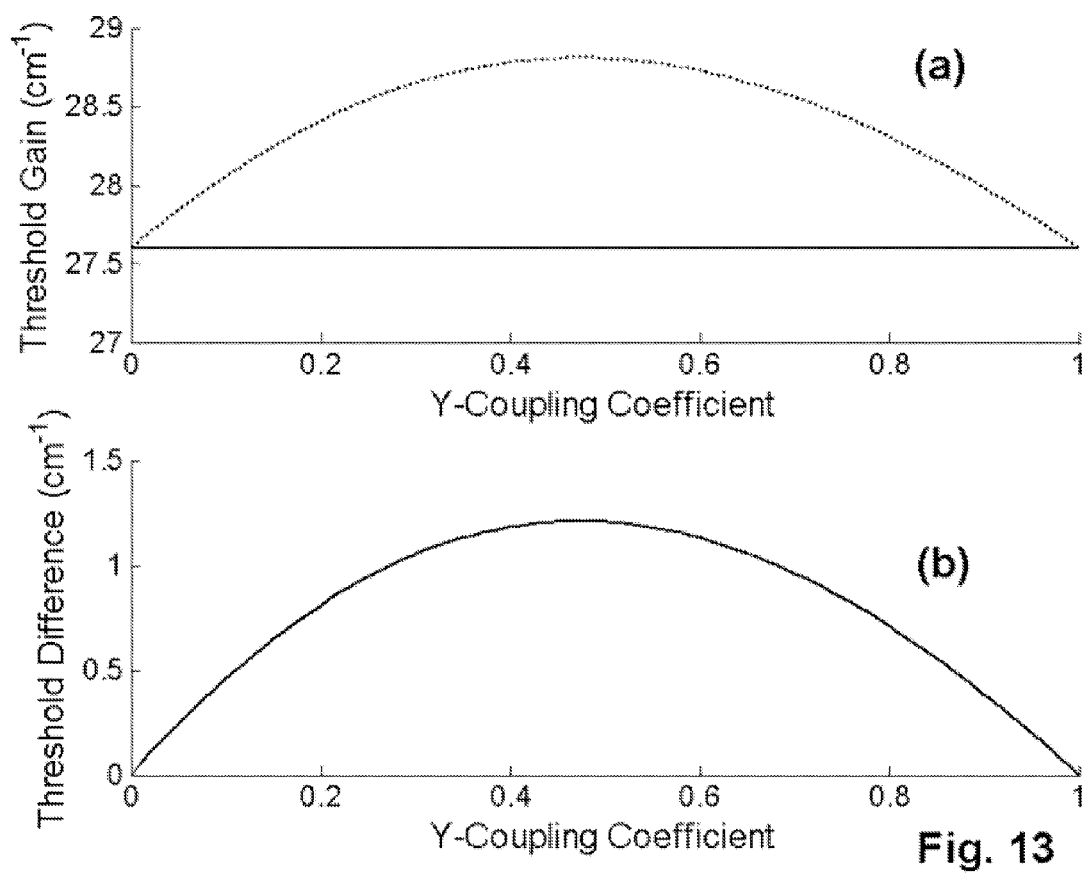
FIG. 13(a) is the threshold gain coefficient of the lowest threshold mode (solid line) and the next lowest threshold mode (dotted line) as a function of the Y-coupling coefficient of the Y-laser.
FIG. 13(b) is the threshold difference between the lowest threshold mode and the next lowest threshold mode of the Y-laser.

Using the same parameters as those in the example for FIG. 10, i.e., L=466.24 μm, and L'=518.31 μm. Also assume that the two cavities are pumped to produce the same round trip gain, i.e., $gL=g'L'$. FIG. 13(*a*) shows the threshold gain coefficient G(=2g) of the lowest threshold mode (solid line) and the next lowest threshold mode (dotted line) as a function of the Y-coupling coefficient $|C_2|^2$. The threshold difference between the two modes is plotted in FIG. 13(*b*). We see that the threshold of the main lasing mode is G=2g=27.6 cm$^{-1}$ which is independent of the coupling coefficient and is the same as the uncoupled cavity of the same length L. The largest threshold difference is only 1.2 cm$^{-1}$ and it occurs at $|C_2|^2=0.5$, i.e., when the Y-branch is an equal power splitter. These compare to a threshold gain coefficient of 22.6 cm$^{-1}$ and a maximum achievable threshold difference of 7.4 cm$^{-1}$ for the V-coupled-cavity laser of the same cavity lengths with a cross-coupling coefficient of 0.1. Therefore, the V-coupled-cavity laser of the present invention can produce a much larger side-mode threshold difference while its lasing threshold for the main mode is lower.

In terms of the threshold condition, the Y-coupled-cavity laser is equivalent to a special case of the V-coupled-cavity laser when $C_{11}C_{22}-C_{12}C_{21}=0$. The coupling coefficients between the cavities can be related to the coupling coefficients of the Y-branch by $C_{11}=C_1C'_1$, $C_{22}=C_2C'_2$, $C_{12}=C'_1C_2$, and $C_{21}=C'_2C_1$. Substituting these equations into Eq. (11), one can obtain Eq. (14). One can also see that, no matter what is the splitting ratio of the Y-branch, the equation $C_{11}C_{22}-C_{12}C_{21}=0$ always holds. This limitation is removed for the V-coupled-cavity of the present invention, which allows the cross-cavity coupling coefficient to be optimized, resulting in a much larger side-mode threshold difference, i.e. a much higher single-mode selectivity.

The V-coupled-cavity laser of the present invention as depicted in FIG. 3 may be mirrored with respect to the facet 20 to form a substantially X-shaped geometry with some similar characteristics. It may also be mirrored with respect to the facet 10 to form a substantially triangular or diamond shaped geometry with similar characteristics.

Figure 14:
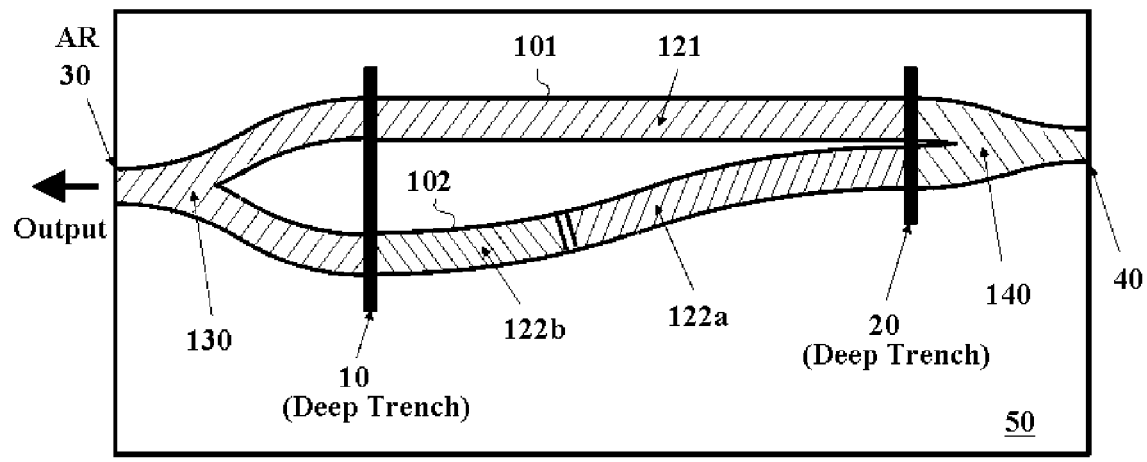
FIG. 14 is a preferred embodiment of the present invention.

A disadvantage of the embodiment of FIG. 3 is that the output power is emitted from two waveguide branches on both sides of the laser cavity, reducing the power utilization efficiency when the light is coupled to a single mode fiber. This disadvantage can be overcome by using an external combiner outside of the laser cavity, either in a monolithic integrated manner or as a separate discrete component. FIG. 14 shows a preferred embodiment of the present invention. The V-coupled-cavity laser as depicted in FIG. 3 is now terminated by the deep-etched trenches 10 and 20 which act as partially reflecting mirrors for the laser cavities. The cross-section of the deep trench is shown in FIG. 4(b). It has substantially vertical sidewalls etched through the waveguide layer 114. The Y-branches 130 and 140 combine the light emitted from the two waveguides 101 and 102 into a single mode waveguide on each side of the laser. The output port, to be coupled to a fiber, can be chosen either on the side of the combiner 130 or on the side of the combiner 140 (or both). In the case the combiner 130 is chosen as the output port, as depicted in the figure, the facet 30 needs to be anti-reflection (AR) coated so that no reflection from the facet 30 is fed back to the laser cavity. The combiner 130 is made substantially transparent either by electrical pumping or by waveguide modification using the quantum-well intermixing or etch-and-regrowth technique. On the other side of the laser, the combiner 140 may be reverse-biased to act as an on-chip power monitor. In this case, the light transmitted through the trench 20 is substantially absorbed by the combiner 140 before reaching the facet 40 so that no reflection from the facet 40 is fed back to the laser cavity.

Figure 15:
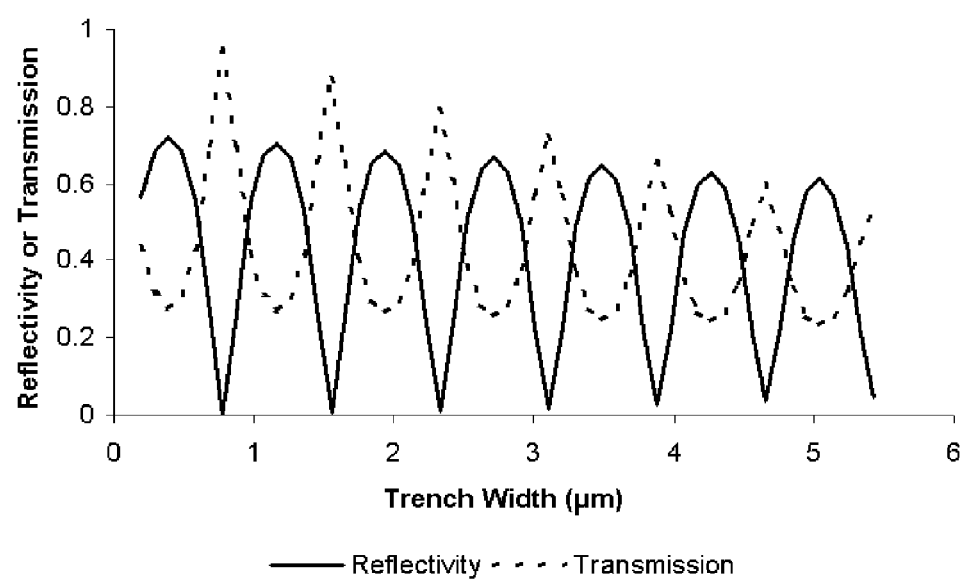
FIG. 15 is the reflectivity and transmission coefficients of an air trench as a function of the trench width at 1550 nm wavelength.

The reflectivity of the deeply etched trench varies with the trench width. FIG. 15 shows the reflectivity and transmission coefficient of the air trench as a function of the trench width at 1550 nm wavelength. In order for the deeply etched trench to act as a high-reflectivity mirror, the trench width is preferably designed to be substantially equal to an odd-integer multiple of quarter-wavelength, i.e., $\lambda/4$, $3\lambda/\lambda4$, $5\lambda/\lambda4$, . . . etc., especially for the back reflector (trench 20) for which a high reflectivity is desirable. A higher reflectivity of the etched trenches results in a lower lasing threshold, without reducing the side-mode threshold difference of the V-coupled-cavity laser.

Preferably, the Y-branched combiner outside of the laser cavity has substantially equal arm lengths so that the light beams emitted from the two waveguides 101 and 102 of the laser are in phase and constructive for the main lasing mode at the output port, regardless of the wavelength switching from channel to channel within the same free spectral range (FSR) as determined by Eq. (3). The resonance condition Eq. (4) of the laser cavities ensures that the optical path length difference between the waveguide 101 and 102 within the laser cavity is an integer multiple of half-wavelength. At the coupling end of the laser (i.e. at the deep trench 20 of FIG. 14), the phases of the propagating fields from the two waveguide braches 101 and 102 are substantially the same. By setting the optical path length difference (electrically adjustable via the electrode 122b) to be an even integer multiple of half-wavelength when the resonant frequencies of both cavities are aligned for the central channel ($f_0$ in FIG. 5), the light beams emitted from the two waveguides 101 and 102 of the laser are in phase at the output facet of the combiner 130. At the same time, for the next substantially aligned resonant frequency ($f_1$ in FIG. 5) located at one FSR away, the optical path length difference is automatically an odd integer multiple of half-wavelength. As a result, the beams emitted from the two waveguides 101 and 102 of the laser are out of phase and destructive at the output facet of the combiner 130. Therefore, the interference effect of the external combiner also helps to filter out the unwanted adjacent aligned resonant modes.

To avoid interference between the signal modulation and the wavelength switching mechanism of the laser, the laser is preferably operated in continuous wave (CW) mode. An extra-cavity modulator is used instead of direct modulation to modulate a data signal onto the laser beam. The extra-cavity modulator may be monolithically integrated with the laser in the form of electro-absorption modulator (EAM). One of such embodiments is also represented by FIG. 14 where the combiner 130 now simultaneously serves as the electro-absorption modulator. The bandgap energy of the waveguide material in the EAM section is preferably slightly larger than that of the laser section so that its absorption coefficient can be changed significantly through the electro-absorption effect (or the quantum confined Stark effect). Again, this bandgap difference can be achieved by using the quantum well intermixing or etch-and-regrowth technique.

Wavelength chirp is an important performance parameter for a semiconductor laser source under high speed modulation. Although the extra-cavity EAM improves the chirp performance considerably compared to direct modulated laser, the chirp problem remains due to the fact that the EAM, whose refractive index intrinsically changes with the modulation of absorption coefficient, is placed in the optical path of the laser beam. The EAM also introduces an extra insertion loss. In a co-pending U.S. patent application Ser. No. 60/622,326, entitled "Q-modulated semiconductor laser", a modulator comprising an electro-absorptive waveguide placed inside an anti-resonant Fabry-Perot cavity which acts as the rear reflector of a semiconductor laser is described. Such an integrated Q-modulation mechanism can be implemented in the V-coupled-cavity laser as depicted in FIG. 14 by using an electro-absorptive waveguide (with a reverse-biased voltage or current injection) in the combiner 140 on the back side of the laser. In this embodiment the deep trench 20 and the cleaved facet 40 (or another etched trench) constitute a Fabry-Perot cavity, which is preferably substantially anti-resonant. The modulation of the absorption coefficient in the combiner 140 results in a modulation of the reflectivity of the rear reflector of the laser, and hence the Q-factor and threshold, and consequently the output power. Such an integrated Q-modulated laser has advantages of low wavelength chirp, high speed and high extinction ratio, in addition to the high single-mode selectivity and wavelength switchability offered by the V-coupled-cavity laser of the present invention.

Figure 16:
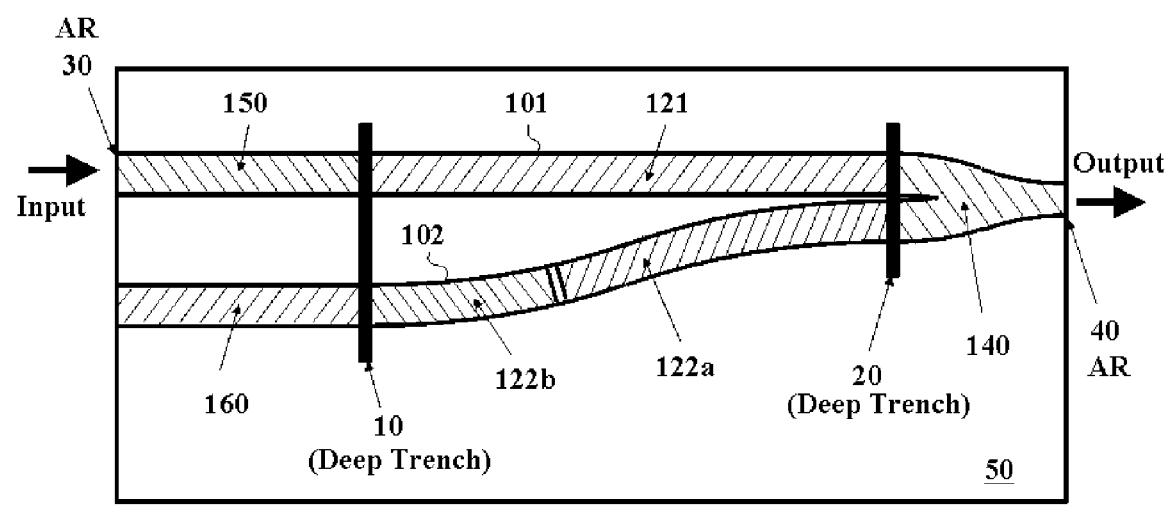
FIG. 16 is another embodiment of the present invention where the V-coupled-cavity laser is used as a switchable wavelength converter.

FIG. 16 is another embodiment of the invention wherein the V-coupled-cavity laser is used as a switchable wavelength converter. An input optical signal is injected into one arm of the V-coupled-cavity laser after being amplified by an on-chip amplifier section 150. The entrance facet of the amplifier is anti-reflection coated so that it does not influence the laser cavity. The wavelength-converted output emits from the combiner 140 through its AR-coated facet 40. Using the same wavelength switching mechanism as in previous embodiments, the wavelength of the output signal may be varied over a wide wavelength range. The embodiment also has a photodetector 160 integrated on the chip as a power monitor. Since the combiner 140 may also be designed as an electro-absorption modulator, the wavelength-switchable laser may be modulated by either an electrical signal or an input optical signal, adding more versatility to the device.

The devices of the present invention have many advantages. In particular, the achievable side-mode threshold difference of the V-coupled-cavity laser is greatly increased compared to the prior-art Y-coupled-cavity laser, and it becomes comparable to that of DFB lasers. The complex fabrication process for DFB grating is not required and the wavelength can be switched over a wide range. Therefore, the laser of the present invention is low-cost and has high functionality, and has a great potential for next-generation reconfigurable optical networks.

Numerous other embodiments can be envisaged without departing from the spirit and scope of the invention.

What is claimed is:

1. A semiconductor laser comprising:
   a first optical cavity comprising a first optical waveguide bounded by two partially reflecting elements, at least a portion of said first optical waveguide being pumped to provide optical gain,
   a second optical cavity comprising a second optical waveguide bounded by two partially reflecting elements, at least a portion of said second optical waveguide being pumped to provide optical gain,
   whereas the first and the second optical waveguides have different optical path lengths, and are disposed side-by-side on a substrate to form substantially V-shaped waveguide branches with substantially no cross-coupling at the open end and a predetermined cross-coupling at the closed end, whereas the cross-coupling coefficient between the first and the second waveguides at the closed end is substantially less than the self-coupling coefficients of the first and the second waveguides for achieving an optimal single-mode selectivity of the laser.

2. A semiconductor laser as defined in claim 1, wherein the first and the second optical cavities share a same partially reflecting element at the closed end of the V-shaped waveguide branches.

3. A semiconductor laser as defined in claim 1, wherein the predetermined cross-coupling between the first and the second waveguides at the closed end is achieved through evanescent coupling.

4. A semiconductor laser as defined in claim 1, wherein the predetermined cross-coupling between the first and the second waveguides at the closed end is achieved through an overlap between the waveguides or their mode fields.

5. A semiconductor laser as defined in claim 1, wherein at least a portion of each of said first and second optical waveguides is pumped electrically by current injection to provide substantially equal round-trip optical gains for the first and the second optical cavities.

6. A semiconductor laser as defined in claim 1, wherein the first optical cavity has an optical path length such that its resonant frequencies correspond substantially to a set of discrete operating channels separated by a constant channel spacing.

7. A semiconductor laser as defined in claim 6, wherein the current or voltage applied to at least a portion of the second optical waveguide is variable in order to change its refractive index and consequently to switch the laser wavelength among the discrete channels as determined by the resonant wavelengths of the first optical cavity.

8. A semiconductor laser as defined in claim 7, wherein a portion of the second optical waveguide has an electrically adjustable effective refractive index for wavelength switching and has a larger bandgap energy as compared to a separate portion of the second optical waveguide which is pumped to provide optical gain.

9. A semiconductor laser as defined in claim 7, wherein the optical path length of the first optical cavity is designed such that its resonant frequencies correspond substantially to a set of discrete operating channels separated by an integer multiple of 50GHz.

10. A semiconductor laser as defined in claim 7, wherein the optical path length difference between the first and the second optical cavities is less than 20 percent.

11. A semiconductor laser as defined in claim 1, wherein some of the partially reflecting elements consist of deeply etched trenches with substantially vertical sidewalls etched through the cross-section of the waveguide.

12. A semiconductor laser as defined in claim 11, wherein the deeply etched trenches are of a width that is substantially equal to an odd-integer multiple of quarter-wavelength.

13. A semiconductor laser as defined in claim 1 further comprises a waveguide combiner placed in the front of the laser outside the laser cavities to combine the optical power emitted from the first and the second optical cavities.

14. A semiconductor laser as defined in claim 13 wherein the waveguide combiner has an anti-reflection coated output facet, said waveguide combiner comprises at least a pair of electrodes for applying an electrical signal to vary the power of the output laser beam.

15. A semiconductor laser as defined in claim 13 further comprises a waveguide combiner placed on the back end of the laser, and has a partially reflecting end facet constituting a substantially anti-resonant cavity, said waveguide combiner also acting as an electro-absorptive Q-modulator to modulate the threshold and consequently the output power emitted from the front end of the laser.

16. A semiconductor laser as defined in claim 1 further comprises an input optical port to receive an input optical signal, said input optical signal being coupled into at least one of the first and second optical cavities, thereby modulate the output power of the laser according to the input optical signal.

17. A semiconductor laser as defined in claim 13 wherein the waveguide combiner is a Y-branched waveguide combiner with substantially equal arm lengths.

18. A semiconductor laser as defined in claim 14 wherein the waveguide combiner comprises an electro-absorptive waveguide.

* * * * *